United States Patent [19]
Budd

[11] Patent Number: 5,182,255
[45] Date of Patent: Jan. 26, 1993

[54] SHAPED AND FIRED ARTICLES OF $YBA_2CU_3O_7$

[75] Inventor: Kenton D. Budd, Woodbury, Minn.

[73] Assignee: Minnesota Mining and Manufacturing Co., St. Paul, Minn.

[21] Appl. No.: 663,296

[22] Filed: Feb. 28, 1991

Related U.S. Application Data

[63] Continuation of Ser. No. 246,977, Sep. 20, 1988, abandoned.

[51] Int. Cl.$^5$ ............................................. H01B 12/00
[52] U.S. Cl. ........................................ 505/1; 428/426; 428/432; 428/433; 428/457; 428/688; 428/901
[58] Field of Search ................ 428/426, 432, 433, 457, 428/688, 901, 930; 505/1, 701-704

[56] References Cited

U.S. PATENT DOCUMENTS

| 4,166,147 | 8/1979 | Lange et al. | 428/328 |
| 4,826,808 | 5/1989 | Yurck et al. | 505/1 |
| 4,939,119 | 7/1990 | Iwata et al. | 505/1 |

OTHER PUBLICATIONS

"Fabrication of $YBa_2Cu_3O_{7-\delta}$ Superconducting Fibers by the Sol-Gel Method," *Advanced Ceramic Materials* vol. 3, No. 5, 1988, pp. 520-522, T. Umeda et al.
Interdiffusion & Interfacial reaction between an $YBa_2Cu_3O_x$ Thin Film a substrates Nakajima et al, Appl. Phys. Letts 53(15) Oct. 1988, 1437ff ACS Symposium Series, vol. 377, pp. 280-290, 1988.
High Tc Superconductors—Composite wire Fabrication, Jin et al. Appl. Phys. Letts. 51(3) Jul. 20, 1987.
Freestanding Films of $YBa_2Cu_3O_{6.9}$, Ginkey et al, MRS Proc Nov. 30 to Dec. 4, 1987.
Bulk & Wire Type Y—Ba—Cu—Oxide SC, Yamada et al, Jap. Journ. Appl. Physics, 26-3 1987.
"Superconducting $YBa_2Cu_3O_{7-x}$ Fibers Prepared by the Sol-Gel Process," *High Temperature Superconductors II, Extended Abstracts 14* (Materials Research Society), pp. 93-96, H. Zheng et al. (presented Apr. 5-8, 1988, Reno, Nevada.
"Formation of Superconducting $YBa_2Cu_3O_y$ Fibers through Sol-Gel Method," *J. Ceram. Soc., Japan*, 96, (1988) pp. 355-359, H. Kozuka et al.
"Fabrication of $YBa_2Cu_3O_y$ Fibers through Sol-Gel Method," *J. Ceram. Soc., Japan*, 96, (1988), pp. 468-470, S. Sakka et al.
"Wet spinning of a single layered perovskite Y—Ba—Cu—O superconductor," *Journal of Materials Science LEtters*, No. 3, Mar., 1988, pp. 283-284, T. Goto et al.
"Fabrication of $YBa_2Cu_3O_{7-x}$ Fibers Using the Modified Sol-Gel Method," *High Temperature Superconductors II, Extended Abstracts 14* (Materials Research Society), pp. 89-92, F. Uchikawa et al. (presented Apr. 5-8, 1988, Reno, Nevada).
"On Synthesis of High $T_c$ Superconducting Perovskites," *Materials Science & Engineering*, Aug. 1988, J. M. Tarascon, et al., pp. 29-36.
"Bulk and thick films of the superconducting phase $YBa_2Cu_3O_{7-y}$ made by controlled precipitation and sol-gel processes," *J. Appl. Phys., 63(8), Apr. 15, 1988*, P. Barboux et al.
Clarke, "The Development of High-Tc Ceramic Superconductors: An Introduction," *Advanced Ceramic Materials*, vol. 2, No. 3B, pp. 273-292 (1987).
Johnson et al., *Advanced Ceramic Materials*, vol. 2, No. 3B, pp. 364-371 (1987). Dunn et al., *Advanced Ceramic Materials*, vol. 2, No. 3B, pp. 343-352, (1987).
Johnson et al., *Advanced Ceramic Materials*, vol. 2, No. 3B, pp. 337-342, (1987).
Cima et al. *Advanced Ceramic Materials*, vol. 2, No. 3B, pp. 329-336, (1987).
Dagani, *C&E News*, May 11, 1987, pp. 7-16.
Uhlmann et al., *Mat. Res. Soc. Symp. Proc.*, vol. 32, pp. 59-62 (1984).

*Primary Examiner*—Patrick J. Ryan
*Assistant Examiner*—Elizabeth Evans
*Attorney, Agent, or Firm*—Gary L. Griswold; Walter N. Kirn; Steven E. Skolnick

[57] ABSTRACT

Shaped articles of superconducting $YBa_2Cu_3O_7$ are made by a sol-gel process from a sol that is a mixture of an aqueous solution of barium hydroxide, a compatible aqueous solution of copper carboxylate, and at least one of a compatible aqueous solution of yttrium carboxylate and an aqueous suspension of colloidal oxide of yttrium. The sol has a Y:Ba:Cu molar ratio of approximately 1:2:3. After adjusting the concentration of the sol, it is formed into a shaped article which is dried and then fired to convert it into orthorhombic superconducting $YBa_2Cu_3O_7$.

7 Claims, No Drawings

SHAPED AND FIRED ARTICLES OF YBA$_2$CU$_3$O$_7$

This is a continuation of application Ser. No. 07/246,977 filed Sept. 20, 1988, now abandoned.

BACKGROUND OF THE INVENTION

1. Field of the Invention

The invention concerns superconductive ceramic and particularly concerns superconductive ceramic having the formula YBa$_2$Cu$_3$O$_7$ that can be produced as a shaped article such as a continuous fiber or a thin film by a sol-gel process.

2. Description of the Related Art

Beginning in 1986, there were reports of a new class of ceramic oxide materials which exhibit superconductivity at unprecedentedly high temperatures. Among these is orthorhombic YBa$_2$Cu$_3$O$_x$ (where x is typically between 6.5 and 7.2) which is often called "YBa$_2$Cu$_3$O$_7$" or "123 superconductive ceramic" by virtue of its metallic molar ratios. It is the first material known to exhibit superconductivity above the boiling point of liquid nitrogen (77° K. or −196° C.). The historical development of these ceramic oxide materials is described in Clarke, "The Development of High-Tc Ceramic Superconductors: An Introduction," *Advanced Ceramic Materials*; , Vol. 2, No. 3B, pp 273–292, (1987).

Other articles in that same special issue of *Advanced Ceramic Materials* describe preliminary studies of the crystallography, physical properties, processing, and theory of these new ceramic oxide materials. Most of these studies report fabrication of bulk ceramic samples by conventional ceramic processing methods. For example, Johnson et al. (pp 364–371) describe mixing, milling, calcining (900° C.), and regrinding of oxide and carbonate powders to yield YBa$_2$Cu$_3$O$_7$ powder that was formed into bulk ceramic samples which were then sintered at 950°–990° C. for 3–8 hours. A few of the studies report liquid chemical methods for preparing these new ceramic oxide materials.

For example, Dunn et al. (pp 343–352) synthesize YBa$_2$Cu$_3$O$_7$ powder by the amorphous citrate process, a well known technique for synthesizing perovskite compounds. After dissolving nitrate salts of Y, Ba and Cu, citric acid was added and water was evaporated from the solution until it became a viscous liquid which was further dehydrated to form an amorphous solid precursor that was then fired to form the desired compound. The large volume of fugitive combustion products formed during pyrolysis would convert the dried precursor into a powder during the firing.

Johnson et al. (pp 337–342) form YBa$_2$Cu$_3$O$_7$ powder by freeze-drying aqueous solutions of Y, Ba and Cu nitrates.

Cima et al. (pp 329–336) are primarily concerned with improving the microstructure of YBa$_2$CuO$_7$ and report high density samples made from powders produced by solid state reaction. However, at page 332, they state that they "have synthesized Y$_{1.2}$Ba$_{0.8}$u(OH)$_x$ by preparing an emulsion of an aqueous solution of Y, Ba, and Cu salts in heptane and coprecipitating the hydroxides in the emulsion droplets (microreactors) by bubbling ammonia through the emulsion."

Dagani, C&E News, May 11, 1987, pages 7–16, also reports studies of YBa$_2$Cu$_3$O$_7$ and says (pp 13–14):

"Because these ceramics tend to be brittle and fragile, they cannot be drawn out to form wires as copper and other ductile metals can. . . (W)ires are made by filling hollow metal wire (such as silver) with Y-Ba-Cu-O powder and drawing out the wire to the desired diameter . . . At 77 K, they measure a current density of about 175 amp per sq cm. Jin (of Bell Labs) admits this is 'rather low,' but he says it's consistent with typical bulk superconductors.

"Another approach is to mix the ceramic powder or its ingredients with an organic binder and then extrude a thin 'noodle' of the plastic material through a die. At that stage, the extruded wire can easily be bent or deformed. But it must be fired to burn off the binder and sinter the powders into a current-carrying filament."

Clarke (pp 280) says concerning YBa$_2$Cu$_3$O$_7$: "The first films to exhibit complete superconductivity above liquid nitrogen were prepared by electron beam evaporation through a partial pressure of oxygen onto sapphire and MgO substrates maintained at typically 450° C. . . . More recently a number of groups have been successful in producing thin films by d.c. magnetron sputtering . . . and also by ion beam sputtering."

At the same page, Clarke discusses fibers, including attempts to pull fibers from a gel and then fire them to convert the gel to superconducting form.

Clarke says (p 277) "that any rare earth element (other than La) could be used to substitute, wholly or in part, for the yttrium without markedly altering the superconducting transition temperature". Dagani says (p 12) researchers have found that "when yttrium is replaced by samarium, europium, gadolinium, dysprosium, holmium, or ytterbium, the ceramic still becomes superconducting around 90 K."

OTHER ART

The formation of ceramic powders, fibers and films by the sol-gel process is well known. See, for example, Uhlmann et al., *Mat. Res. Soc. Symp. Proc.*, Vol. 32, pp 59–62 (1984) and U.S. Pat. No. 4,166,147 (Lange et al.). The latter teaches, among other things, the shaping, gelling, and firing of metal oxide sol or solution precursors to provide shaped articles such as fibers useful in fabricating woven, felted, knitted, and other types of textiles. It also is known that as compared to ceramic thin films made by vacuum techniques, ceramic thin films can be formed more economically by the sol-gel process.

SUMMARY OF THE INVENTION

The invention provides improvements in the synthesis of the superconducting orthorhombic YBa$_2$Cu$_3$O$_x$ (where x is between 6.5 and 7.2) which is here called "YBa$_2$Cu$_3$O$_7$". The invention specifically provides an improved method of making shaped articles of YBa$_2$Cu$_3$O$_7$. The improved method is a sol-gel process involving the sequential steps of a) mixing an aqueous solution of barium hydroxide with a compatible aqueous solution of copper carboxylate and at least one of a compatible aqueous solution of yttrium carboxylate and an aqueous suspension of colloidal oxide of yttrium to provide a sol having a Y:-Ba:Cu molar ratio of approximately 1:2:3, b) adjusting the concentration of the sol to permit it to be formed into a shaped article, c) forming and drying the sol into a shaped article, and d) firing to convert the shaped article into orthorhombic superconducting $YBa_2Cu_3O_7$.

By "compatible" is meant that the sol does not precipitate an insoluble compound before the shaped article can be formed in step c). The sol usually is a clear blue liquid that exhibits continuously increasing, but stable, viscosities when concentrated: is metastable when supersaturated; and is clear, assay, and homogeneous when dried, when the sol is somewhat translucent, it may become almost transparent upon being concentrated to a fiberizable viscosity.

Included within "oxide of yttrium" are hydrous oxides.

Y and Cu carboxylates that are most useful in the above-outlined method have from 2 to 3 carbon atoms and, when admixed with aqueous barium hydroxide, are suitably chelating to resist the formation of insoluble hydrolysis products (e.g., oxides or hydroxides) and yet yield products having sufficient molecular complexity to provide a viscous, metastable precursor when concentrated. Carboxylates having 2-3 carbon atoms also afford green strength to the shaped articles while keeping the content of fugitive material to a minimum.

Among useful shaped articles which can be produced by the novel method are superconducting thin films that can be formed to cover large and/or complex shapes by economical techniques such as by spin-casting, spraying or dipping. In order to produce superconducting films of $YBa_2Cu_3O_7$ having thicknesses exceeding about 0.5 $\mu$m, it may be necessary to produce those films in layers in order to avoid cracking. To guard against cracking, each layer preferably does not exceed about 0.25 $\mu$m in thickness, while thicknesses much less than 0.05 $\mu$m may be uneconomical and difficult to form as continuous layers. Each layer should be individually heated sufficiently to drive off fugitive material and to render it insoluble before applying the next layer.

The invention also enables the production of continuous superconducting fibers of sufficiently fine diameter to be usefully flexible. To be usefully flexible, a fiber may need to be less than 50 $\mu$m in diameter. Its preferred diameter may be from 0.5 to 10 $\mu$m, because it may be difficult to avoid undue porosity and distortion due to outgassing if the diameter were significantly larger.

When making a superconducting fiber of the invention from the sol produced in step a) of the above-outlined method, the sol should be of a fiberizable viscosity, and this may require the concentration of the sol to be increased in step b) by evaporating water. On the other hand, when making a superconducting thin film, it may be desirable to dilute the sol so that the thin film can be sufficiently thin to avoid cracking.

DETAILED DESCRIPTION OF THE INVENTION

As is known in the art, superconducting $YBa_2Cu_3O_7$ fibers would degrade chemically upon exposure to atmospheric moisture and preferably are protected by a coating of ductile metal that also would enhance their mechanical properties. The ductile metal preferably is electrically conductive, e.g., a silver coating applied by electroplating, especially when the $YBa_2Cu_3O_7$ fibers are discontinous. A useful composite wire-like electrical conductor comprises a plurality of orthorhombic superconducting $YBa_2Cu_3O_7$ fibers encased in a matrix of electrically conductive metal.

Before converting the sol into a shaped article, it usually is possible to suspend in the sol finely divided $YBa_2Cu_3O_7$ powder in amounts such that it provides up to about one-half of the total weight of the superconductor.

In step a) of the above-outlined method preferably 0.1 to 0.5 moll aqueous solutions of the Cu and Y containing constituents are combined, followed by addition of 0.1 to 0.5 molal barium hydroxide solution while rapidly stirring the mixture. The resultant dilute mixtures are stable to the precipitation of insoluble hydrolysis products for a period of days to weeks. Furthermore, the mixtures are metastable when concentrated and resist the precipitation of crystalline salts from the supersaturated mixtures for several hours to several days.

When making shaped articles of orthorhombic superconducting $YBa_2Cu_3O_7$ by the above-outlined method of the invention, compositional variations may be introduced, e.g., to increase the resistance of the sol to precipitation of hydrolysis products upon the addition of barium hydroxide, or to help prevent precipitation of crystalline salts upon concentrating the sol, or to modify the pyrolysis behavior. For example, various combinations of carboxylate salts of Y and Cu can be employed, including combinations with mineral salts. Other useful compositional variations involve the addition of small amounts of carboxylic or mineral acids to the sol and/or the use of off-stoichiometric Y-Ba-Cu-O formulations while maintaining a sol that predominantly yields the $YBa_2Cu_3O_7$ phase.

To illustrate a useful compositional variation, resistance to the precipitation of hydrolysis products can be enhanced by adding to the sol small quantities of carboxylic acid such as acetic acid and lactic acid, preferably after completing step a) of the above-outlined process, but not more than about 1 equivalent of acid per mole of Ba. Larger quantities would tend toward complete neutralization of the hydroxide, yielding essentially stoichiometric salt solutions which cannot be concentrated to a suitably high viscosity and thus would form inhomogeneous mixtures of crystalline salts upon drying.

EXAMPLE 1

Aqueous stock solutions were made by dissolving in water commercially available compounds to provide 0.1 mole yttrium acetate/kg of solution,
0.2 mole barium hydroxide/kg of solution, and
0.3 mole copper acetate/kg of solution.

200 g of each solution were combined into a sol that was concentrated at 35° C. using a rotary evaporator until sufficiently viscous for fiber formation (estimated to be about 50,000-100,000 cp).

Fibers were spun by extruding through 75-$\mu$m holes at 200 psi (1380 kPa), drying, stretching through a 6-foot (2-m) tower at 80°-90° F. (27°-32° C.), 30% R.H., and winding at about 40 feet/min. (13 m/min.). The fibers were clear blue, transparent, 10-30 $\mu$m in diameter, and were cut to lengths of about 10 to 15 cm to fit into a ceramic boat.

After being stored in a dryer at 95° C. for about one month, the fibers were converted to $YBa_2Cu_3O_7$ by firing from room temperature to 950° C. using a 150° C./hour heating rate and then holding at 950° C. for 30 minutes. The fired fibers were porous and fragile and somewhat deformed. X-ray diffraction showed that the fired fibers were monophasic and orthorhombic, and scanning electron microscopy showed them to have a grain size of about 1 to 5 μm.

EXAMPLE 2

Dissolved in water were:

0.05 mole suspension of colloidal $Y_2O_3$/kg (from "Nyacol"), 0.2 mole barium hydroxide/kg, and 0.3 mole copper lactate/kg.

500 g of each were combined to produce a sol that was concentrated at 35° C. using a rotary evaporator until its viscosity was about the same as was attained in Example 1.

Fibers were spun by extruding through 75-μm holes at 300 psi (2070 kPa), drying, stretching through a 6-foot (2-m) tower at about 90° F. (32° C.), 40% R.H., and winding at about 30 feet/min. (9 m/min.). The fibers were clear blue transparent, and 15-35 μm in diameter.

After being stored in a dryer at 95° C. for about one month, the fibers were converted to orthorhombic $YBa_2Cu_3O_7$ by firing at linearly increasing temperatures as follows:

RT to 250° C. over 2 hours

250° to 300° C. over 2 hours

300° to 400° C. over 1 hour plus 3 hours at 400° C.

400° to 600° C. over 3 hours

600° to 900° C. over 1 hour plus 1 hour at 900° C.

The fired fibers were less deformed than were those of Example 1 and also were porous and fragile. Their grain size was about 0.5 to 3 μm.

EXAMPLE 3

The concentrated sol of Example 2 was diluted with water, then reconcentrated by the procedure of Example 2 until the viscosity was about one-half that attained in Examples 1 and 2. This was extruded into a jet of air to produce fibers that were collected on a screen. The fibers were clear blue, transparent, and 0.5 to 10 μm in diameter.

The fibers were converted to orthorhombic $YBa_2Cu_3O_7$ by firing at linearly increasing temperatures as follows:

25° to 260° C. over 1.5 hours

260° to 600° C. over 12 hours

600° to 900° C. over 2 hours plus ½ hour at 900° C.

Of these fired fibers, those that were less than about 3 μm in diameter were completely dense and less fragile than were the fired fibers of Examples 1 and 2.

EXAMPLE 4

Three aqueous systems were used, namely 0.620 mole suspension of colloidal $Y_2O_3$/kg (from "Nyacol"), 182 mole barium hydroxide/kg, and 0.470 mole copper lactate/kg.

36.3 g, 495 g, and 287 g of these three systems, respectively, were combined to provide a sol having a Y:Ba:Cu molar ratio of 1:2:3. This was concentrated to about 100 ml at 35° C. using a rotary evaporator. To the concentrated sol (which contained enough precursor for 30g of $YBa_2Cu_3O_7$ was added 20 g of yet milled $YBaCu_3O_7$ powder (mean diameter about 2-3 μm). The resulting mixture was milled in a "Spex" shaker mill and then concentrated in the same way to a fiberizable viscosity.

Fibers were spun by extruding through 75-μm holes at about 90° F. (32° C.), 35% R.H., and 50 ft/min. (15.2 m/min.). The resulting black fibers were 10-60 μm in diameter and were fired at 1° C./min. from RT to 925° C. and held at 925° C. for one hour. This converted the fibers to orthorhombic $YBa_2Cu_3O_7$ having diameters ranging from 5 to 60 μm. A resistance of 335 ohms/cm at 25° C. was measured for a fired fiber having a diameter of about 43 μm.

EXAMPLE 5

Using the same aqueous stock solutions as those of Example 2, 100 g of each were combined and concentrated at 35° C. using a rotary evaporator until there was 1 mole of total cations or metal atoms (Y+Ba+Cu) per kg of sol. To this was added two drops of nonionic surfactant ("Tergitol" TMN-6 from Union Carbide) per 25 g of sol. The sol was then deposited onto a 1 cm by 1 cm single crystal of MgO having 100 orientation by dispensing through a 0.22 μm filter, spin-casting at 2000 rpm, and heat-treating at about 350° C. on a hot plate surface. After depositing and sequentially heat-treating nine identical layers, the whole was placed in a furnace at 500° C. for a few minutes, transferred to a 975° C. furnace for 5 min., and then returned to the 500° C. furnace. Power was immediately turned off, and the furnace was allowed to cool to room temperature. The entire process was repeated to create a thin film of 20 layers of orthorhombic $YBa_2Cu_3O_7$.

The resulting 20-layer film was highly oriented (c axis perpendicular to the surface of the substrate) and had a superconducting transition characterized by 90% of normal metallic resistivity at 87° K., 50% of normal metallic resistivity at 79° K., 10% of normal metallic resistivity at 72° K., and R=0 at about 70° K.

EXAMPLE 6

Using the same aqueous systems as those of Example 2, 150 g of each were combined and concentrated at 35° C. using a rotary evaporator until the mass of the sol was 100 g. The sol was then spray-dried using a laboratory-scale spray dryer at a nozzle temperature of about 167° C. The resulting powder was fired at 500° C. for one hour, milled in heptane for one hour, dried, pressed into a rectangular bar at 40,000 psi (276 MPa), and sintered at 950° C. for 5 hours in air, using 1° C./min. heating rate. The fired bar was dense, orthorhombic $YBa_2Cu_3O_7$ with a grain size of 0.5 to 5.0 μm.

EXAMPLE 7

Three aqueous solutions were used:

0.1 mole yttrium acrylate/kg, 0.2 mole barium hydroxide/kg, and 0.3 mole copper acrylate/kg.

350 g of each of these three solutions, 1000 g of methoxyethanol, and 0.05 moles of acrylic acid were combined into a sol that was concentrated to fiberizable viscosity.

Fibers were spun in the same way as in Example 1, but with difficulty due to breakage and lower green strength.

What is claimed is:

1. A fine diameter fiber comprising orthorhombic superconducting $YBa_2Cu_3O_x$, wherein x is in the range of from 6.5 to 7.2 and further wherein said fiber has a diameter greater than 0μ and less than or equal to about 50μ.

2. A fiber according to claim 1 wherein said fiber has a diameter in the range of about 0.5μ to about 10μ.

3. A fiber according to claim 1 wherein said fiber has a grain size in the range of 0.5μ to 5μ.

4. A continuous fiber comprising orthorhombic superconducting $YBa_2Cu_3O_x$, wherein x is in the range of from 6.5 to 7.2 and further wherein said fiber has a diameter greater than $0\mu$ and less than or equal to about $50\mu$.

5. A continuous fiber according to claim 4 wherein said fiber has a diameter in the range of about $0.5\mu$ to about $10\mu$.

6. A fiber according to claim 4 wherein said fiber has a layer of silver metal thereon.

7. A fiber according to claim 1 wherein said fiber has a layer of silver metal thereon.

* * * * *

UNITED STATES PATENT AND TRADEMARK OFFICE
CERTIFICATE OF CORRECTION

PATENT NO. : 5,182,255
DATED : January 26, 1993
INVENTOR(S) : Kenton D. Budd It is certified that error appears in the above-identified patent and that said Letters Patent is hereby corrected as shown below:

Col. 1, line 59  "$Y_{1.2}B_{0.8}u(OH)_x$" should read -- $Y_{1.2}B_{0.8}Cu(OH)_x$ --.

Col. 3, line 8 "assay" should read --glassy--.

Col. 3, line 9  "dried, when the" should read --dried. When the--.

Col. 4, line 7  "moll" should read --molal--.

Col. 5, line 60  "yet milled" should read --jet-milled--.

Signed and Sealed this

Twenty-second Day of February, 1994

*Attest:*

BRUCE LEHMAN

*Attesting Officer*   *Commissioner of Patents and Trademarks*